(12) United States Patent
Hsu et al.

(10) Patent No.: US 8,912,602 B2
(45) Date of Patent: Dec. 16, 2014

(54) FINFETS AND METHODS FOR FORMING THE SAME

(75) Inventors: Yu-Rung Hsu, Tainan (TW); Chen-Hua Yu, Hsinchu (TW); Chen-Nan Yeh, Sinfong Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 414 days.

(21) Appl. No.: 12/758,426

(22) Filed: Apr. 12, 2010

(65) Prior Publication Data

US 2010/0258870 A1    Oct. 14, 2010

Related U.S. Application Data

(60) Provisional application No. 61/169,152, filed on Apr. 14, 2009.

(51) Int. Cl.
*H01L 27/12* (2006.01)
*H01L 29/78* (2006.01)
*H01L 29/66* (2006.01)

(52) U.S. Cl.
CPC ........ *H01L 29/785* (2013.01); *H01L 29/66795* (2013.01)
USPC ............ 257/347; 257/E29.255; 257/E21.409; 438/151; 438/197

(58) Field of Classification Search
None
See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 5,767,732 A | 6/1998 | Lee et al. | |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,210,999 B1 * | 4/2001 | Gardner et al. | 438/183 |
| 6,299,724 B1 | 10/2001 | Fayfield et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |

(Continued)

FOREIGN PATENT DOCUMENTS

| | | |
|---|---|---|
| CN | 1945829 | 4/2004 |
| CN | 101179046 | 5/2005 |

(Continued)

OTHER PUBLICATIONS

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

(Continued)

*Primary Examiner* — Fei Fei Yeung Lopez
(74) *Attorney, Agent, or Firm* — Lowe Hauptman & Ham, LLP (57) ABSTRACT

A Fin field effect transistor includes a fin disposed over a substrate. A gate is disposed over a channel portion of the fin. A source region is disposed at a first end of the fin. A drain region is disposed at a second end of the fin. The source region and the drain region are spaced from the substrate by at least one air gap.

20 Claims, 11 Drawing Sheets

(56) References Cited

U.S. PATENT DOCUMENTS

| | | | |
|---|---|---|---|
| 6,713,365 B2 | 3/2004 | Lin et al. | |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,791,155 B1 | 9/2004 | Lo et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 | 9/2005 | Sharma et al. | |
| 6,949,768 B1 | 9/2005 | Anderson et al. | |
| 6,964,832 B2 | 11/2005 | Moniwa et al. | |
| 7,009,273 B2 | 3/2006 | Inoh et al. | |
| 7,018,901 B1 | 3/2006 | Thean et al. | |
| 7,026,232 B1 | 4/2006 | Koontz et al. | |
| 7,067,400 B2 | 6/2006 | Bedell et al. | |
| 7,078,312 B1 | 7/2006 | Sutanto et al. | |
| 7,084,079 B2 | 8/2006 | Conti et al. | |
| 7,084,506 B2 | 8/2006 | Takao | |
| 7,112,495 B2 | 9/2006 | Ko et al. | |
| 7,153,744 B2 | 12/2006 | Chen et al. | |
| 7,157,351 B2 | 1/2007 | Cheng et al. | |
| 7,190,050 B2 | 3/2007 | King et al. | |
| 7,193,399 B2 | 3/2007 | Aikawa | |
| 7,247,887 B2 | 7/2007 | King et al. | |
| 7,265,008 B2 | 9/2007 | King et al. | |
| 7,265,418 B2 | 9/2007 | Yun et al. | |
| 7,297,600 B2 | 11/2007 | Oh et al. | |
| 7,300,837 B2* | 11/2007 | Chen et al. | 438/213 |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,351,622 B2 | 4/2008 | Buh et al. | |
| 7,358,166 B2 | 4/2008 | Agnello et al. | |
| 7,361,563 B2 | 4/2008 | Shin et al. | |
| 7,374,986 B2 | 5/2008 | Kim et al. | |
| 7,394,116 B2 | 7/2008 | Kim et al. | |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 | 9/2008 | Liu et al. | |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,550,332 B2 | 6/2009 | Yang | |
| 7,598,145 B2 | 10/2009 | Damlencourt et al. | |
| 7,605,449 B2 | 10/2009 | Liu et al. | |
| 7,682,911 B2 | 3/2010 | Jang et al. | |
| 7,759,228 B2 | 7/2010 | Sugiyama et al. | |
| 7,795,097 B2 | 9/2010 | Pas | |
| 7,798,332 B1 | 9/2010 | Brunet | |
| 7,820,513 B2 | 10/2010 | Hareland et al. | |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,339 B2 | 4/2011 | Meunier-Beillard et al. | |
| 7,960,791 B2 | 6/2011 | Anderson et al. | |
| 7,985,633 B2 | 7/2011 | Cai et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 8,076,189 B2 | 12/2011 | Grant | |
| 8,101,475 B2 | 1/2012 | Oh et al. | |
| 2003/0080361 A1 | 5/2003 | Murthy et al. | |
| 2003/0109086 A1 | 6/2003 | Arao | |
| 2003/0234422 A1 | 12/2003 | Wang et al. | |
| 2004/0075121 A1* | 4/2004 | Yu et al. | 257/288 |
| 2004/0129998 A1 | 7/2004 | Inoh et al. | |
| 2004/0192067 A1 | 9/2004 | Ghyselen et al. | |
| 2004/0219722 A1* | 11/2004 | Pham et al. | 438/157 |
| 2004/0259315 A1* | 12/2004 | Sakaguchi et al. | 438/285 |
| 2005/0020020 A1 | 1/2005 | Collaert et al. | |
| 2005/0051865 A1 | 3/2005 | Lee et al. | |
| 2005/0082616 A1 | 4/2005 | Chen et al. | |
| 2005/0153490 A1 | 7/2005 | Yoon et al. | |
| 2005/0170593 A1 | 8/2005 | Kang et al. | |
| 2005/0212080 A1 | 9/2005 | Wu et al. | |
| 2005/0221591 A1 | 10/2005 | Bedell et al. | |
| 2005/0224800 A1 | 10/2005 | Lindert et al. | |
| 2005/0233598 A1 | 10/2005 | Jung et al. | |
| 2005/0266698 A1* | 12/2005 | Cooney et al. | 438/765 |
| 2005/0280102 A1 | 12/2005 | Oh et al. | |
| 2006/0038230 A1 | 2/2006 | Ueno et al. | |
| 2006/0068553 A1 | 3/2006 | Thean et al. | |
| 2006/0091481 A1* | 5/2006 | Li et al. | 257/401 |
| 2006/0091482 A1* | 5/2006 | Kim et al. | 257/401 |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |
| 2006/0151808 A1 | 7/2006 | Chen et al. | |
| 2006/0153995 A1 | 7/2006 | Narwankar et al. | |
| 2006/0166475 A1 | 7/2006 | Mantl | |
| 2006/0214212 A1 | 9/2006 | Horita et al. | |
| 2006/0258156 A1 | 11/2006 | Kittl | |
| 2007/0001173 A1 | 1/2007 | Brask et al. | |
| 2007/0004218 A1 | 1/2007 | Lee et al. | |
| 2007/0015334 A1 | 1/2007 | Kittl et al. | |
| 2007/0020827 A1 | 1/2007 | Buh et al. | |
| 2007/0024349 A1 | 2/2007 | Tsukude | |
| 2007/0029576 A1 | 2/2007 | Nowak et al. | |
| 2007/0048907 A1 | 3/2007 | Lee et al. | |
| 2007/0076477 A1* | 4/2007 | Hwang et al. | 365/185.08 |
| 2007/0085134 A1* | 4/2007 | Anderson et al. | 257/326 |
| 2007/0093010 A1 | 4/2007 | Mathew et al. | |
| 2007/0093036 A1* | 4/2007 | Cheng et al. | 438/458 |
| 2007/0096148 A1 | 5/2007 | Hoentschel et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0145483 A1* | 6/2007 | Ono | 257/353 |
| 2007/0145487 A1 | 6/2007 | Kavalieros et al. | |
| 2007/0152276 A1 | 7/2007 | Arnold et al. | |
| 2007/0166929 A1 | 7/2007 | Matsumoto et al. | |
| 2007/0178637 A1 | 8/2007 | Jung et al. | |
| 2007/0221956 A1 | 9/2007 | Inaba | |
| 2007/0236278 A1 | 10/2007 | Hur et al. | |
| 2007/0241414 A1 | 10/2007 | Narihiro | |
| 2007/0247906 A1 | 10/2007 | Watanabe et al. | |
| 2007/0254440 A1 | 11/2007 | Daval | |
| 2008/0001171 A1 | 1/2008 | Tezuka et al. | |
| 2008/0036001 A1 | 2/2008 | Yun et al. | |
| 2008/0042209 A1 | 2/2008 | Tan et al. | |
| 2008/0050882 A1 | 2/2008 | Bevan et al. | |
| 2008/0085580 A1 | 4/2008 | Doyle et al. | |
| 2008/0085590 A1 | 4/2008 | Yao et al. | |
| 2008/0095954 A1 | 4/2008 | Gabelnick et al. | |
| 2008/0102586 A1 | 5/2008 | Park | |
| 2008/0124878 A1 | 5/2008 | Cook et al. | |
| 2008/0227241 A1* | 9/2008 | Nakabayashi et al. | 438/150 |
| 2008/0265344 A1 | 10/2008 | Mehrad et al. | |
| 2008/0290470 A1 | 11/2008 | King et al. | |
| 2008/0296632 A1 | 12/2008 | Moroz et al. | |
| 2008/0318392 A1 | 12/2008 | Hung et al. | |
| 2009/0026540 A1 | 1/2009 | Sasaki et al. | |
| 2009/0039388 A1 | 2/2009 | Teo et al. | |
| 2009/0066763 A1 | 3/2009 | Fujii et al. | |
| 2009/0108351 A1* | 4/2009 | Yang et al. | 257/347 |
| 2009/0155969 A1 | 6/2009 | Chakravarti et al. | |
| 2009/0166625 A1 | 7/2009 | Ting et al. | |
| 2009/0181477 A1 | 7/2009 | King et al. | |
| 2009/0200612 A1 | 8/2009 | Koldiaev | |
| 2009/0239347 A1 | 9/2009 | Ting et al. | |
| 2009/0321836 A1 | 12/2009 | Wei et al. | |
| 2010/0155790 A1 | 6/2010 | Lin et al. | |

(56) References Cited

U.S. PATENT DOCUMENTS

| | | |
|---|---|---|
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Office Action dated May 2, 2012 from corresponding application No. CN 201010196345.0.

Office Action dated May 4, 2012 from corresponding application No. CN 201010243667.6.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm, 2012.

Merriam Webster definition of substantially retrieved from the internet <URL:http://www.merriam-webster.com/dictionary/substantial>, 2012.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

* cited by examiner

FINFETS AND METHODS FOR FORMING THE SAME

CROSS-REFERENCE TO RELATED APPLICATIONS

The present application claims priority of U.S. Application Ser. No. 61/169,152, filed on Apr. 14, 2009, which is incorporated herein by reference in its entirety The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The present application relates generally to the field of semiconductor devices, and more particularly, to Fin field effect transistors (FinFETs) and methods for forming the FinFETs.

BACKGROUND

The semiconductor integrated circuit (IC) industry has experienced rapid growth. Technological advances in IC materials and design have produced generations of ICs where each generation has smaller and more complex circuits than the previous generation. For example, the semiconductor industry ardently strives to decrease the size of memory cells. One strategy that has been employed includes the use of multiple gate transistors, otherwise known as FinFETs. A conventional FinFET device is fabricated using a silicon fin raised from the semiconductor substrate. The channel of the device is formed in the fin, and a gate is provided over (e.g., surrounding) the fin—for example, in contact with the top and the sidewalls of the fin. The gate surrounding the channel (e.g., fin) is beneficial in that allows control of the channel from three sides. Source/drain regions are formed at two ends of the fin. The fin including the source/drain regions contacts the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As noted, the conventional FinFET has the source/drain regions contacting the substrate. It is found that during the operation of the FinFET leakage paths are found between the source/drain regions of the fin and the substrate. It is also found that a conventional FinFET having shallow trench isolation (STI) for insulating the gate from the substrate suffers an etching loading effect. The etching loading effect causes fin-height variations.

To solve the leakage issue, formation of FinFETs on a silicon-on-insulator (SOI) substrate has been proposed. The process for forming the FinFETs on a SOI substrate, however, is expensive due to the cost for using the SOI substrate.

Embodiments of the disclosure relate to devices and methods for forming the devices by forming at least one air gap or at least one oxide-containing material to insulate source/drain regions of a fin from the substrate. The air gap or the oxide-containing material can eliminate leakage paths between the fin and the substrate thereby reducing leakage currents of the devices.

Figure 1:
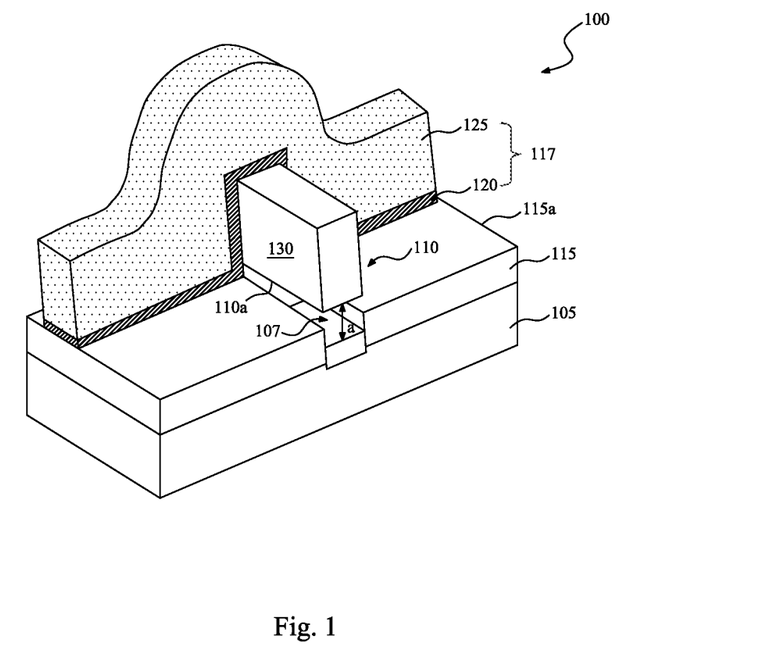
FIG. 1 is a schematic 3-D drawing illustrating an exemplary FinFET.

FIG. 1 is a schematic 3-D drawing illustrating an exemplary FinFET. In FIG. 1, a FinFET 100 can include a fin 110 disposed over a substrate 105 by at least one air gap, e.g., a gap 107. A gate 117 can include a gate dielectric 120 and a gate electrode 125. The gate 117 can be disposed over a channel portion of the fin 110. In some embodiments, the FinFET 100 can include a dielectric layer 115 formed to insulate the substrate 105 from the gate 117. A first source/drain region 130 is disposed at an end of the fin 110. A second source/drain region (not shown) is disposed at the other end of the fin 110. The source/drain regions are spaced from the substrate 105 by the air gap 107. The air gap 107 is formed to insulate the source/drain regions 130 from the substrate 105 to reduce leakage currents between the source/drain regions 130 and the substrate 105. In some embodiments for 32-nm technology, the distance "a" of the air gap 107 from the substrate 105 to the fin 110 can be about 200 nm. One skilled in the art can modify the distance "a" to achieve a desired electrical insulation between the source/drain region 130 and the substrate 105.

In some embodiments, the substrate 105 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, the fin 110 can include semiconductor material such as silicon, silicon germanium, and/or other suitable materials. The fin 110 can include the channel of the FinFET 100 covered by the gate 117. In some embodiments, two ends of the fin 110 can be designated as the source/drain regions of the FinFET 100.

In some embodiments, a bottom surface 110a of the fin 110 is over the top surface 115a of the dielectric layer 115. The dielectric layer 115 can include dielectric materials such as silicon oxide, silicon nitride, silicon oxynitride, another dielectric material that is capable of insulating the substrate 105 from the gate 117, and/or the combinations thereof. In some embodiments, the dielectric layer 115 can include shallow trench isolation (STI) structures (not shown) formed over the substrate 105. In some embodiments for 32-nm technology, the dielectric layer 115 can have a thickness of about 1800 Å.

The gate dielectric 120 can be formed below the gate electrode 125. The gate dielectric 120 can be a single layer or a multi-layer structure. In some embodiments for multi-layer structures, the gate dielectric 120 can include an interfacial layer and a high-k dielectric layer. The interfacial layer can include at least one dielectric material such as, silicon oxide, silicon nitride, silicon oxynitride, another dielectric material, and/or any combination thereof. The high-k dielectric layer can have at least one high k material including hafnium silicate, hafnium oxide, zirconium oxide, aluminum oxide, hafnium dioxide-alumina ($HfO_2$—$Al_2O_3$) alloy, and/or combinations thereof. In some embodiments for 32-nm technology, the interfacial layer can have a thickness between about 8 Å and about 10 Å. The high-k dielectric layer can have a thickness of about 40 Å.

In some embodiments, the gate electrode 125 can include at least one material, such as polysilicon, silicon-germanium, a metal material including metal compounds such as, Mo, Cu, W, Ti, Ta, TiN, TaN, NiSi, CoSi, and/or other suitable conductive materials known in the art. In some embodiments for 32-nm technology, the gate electrode 125 can have a thickness of about 600 Å. In some embodiments, the FinFET 100 can include spacers on sidewalls of the fin 110.

Figure 2:
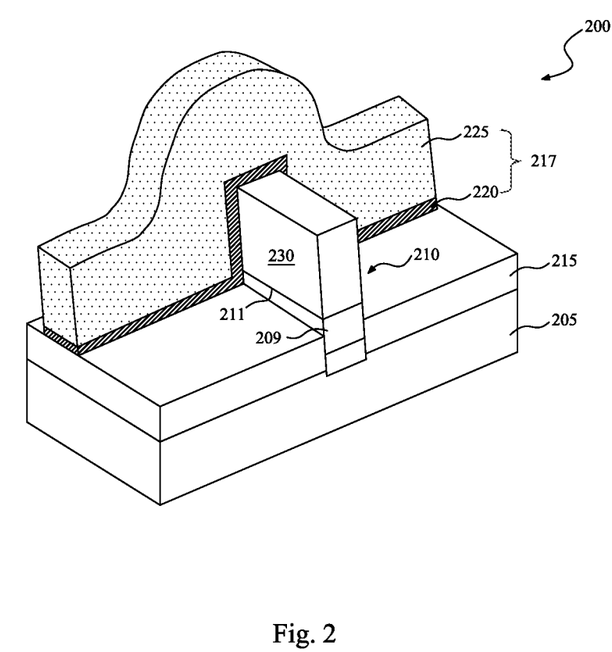
FIG. 2 is a schematic 3-D drawing illustrating another exemplary FinFET.

FIG. 2 is a schematic 3-D drawing illustrating another exemplary FinFET. In FIG. 2, a FinFET 200 can include a fin 210 over a substrate 205. A gate 217 can include a gate dielectric 220 and a gate electrode 225. The gate 217 can be over a channel portion of the fin 210. A source/drain region 230 is disposed at an end of the fin 210. Another source/drain region (not shown) is disposed at the other end of the fin 210. At least one oxide-containing layer, e.g., oxide-containing layer 209, can be disposed between the source/drain regions of FinFET 200 and the substrate 205. In some embodiments, the oxide-containing layer 209 can be formed by oxidizing porous silicon with an oxygen-containing gas. The oxide-containing layer 209 is formed to insulate the source/drain regions of the FinFET 200 from the substrate 205 to reduce leakage currents therebetween. In some embodiments, an interface 211 between the fin 210 and the oxide-containing layer 209 is substantially planar. In some embodiments, the FinFET 200 can include a dielectric layer 215 formed to insulate the substrate 205 from the gate 217. Items of FIG. 2 that are the same or similar items in FIG. 1 are indicated by the same reference numerals, increased by 100.

The FinFETs 100 and/or 200 can be formed within a package which can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

Following are descriptions for exemplary methods for forming a FinFET. In some embodiments, a method for forming a FinFET can include forming a porous silicon portion between a fin and a substrate. A gate is formed over a channel portion of the fin. A source region can be formed at a first end of the fin. A drain region can be formed at a second end of the fin. In some embodiments, the porous silicon portion can be removed to form at least one air gap to insulate the fin from the substrate. In other embodiments, the porous silicon portion can be oxidized to form an oxide-containing material to insulate the fin from the substrate.

Figure 3A:
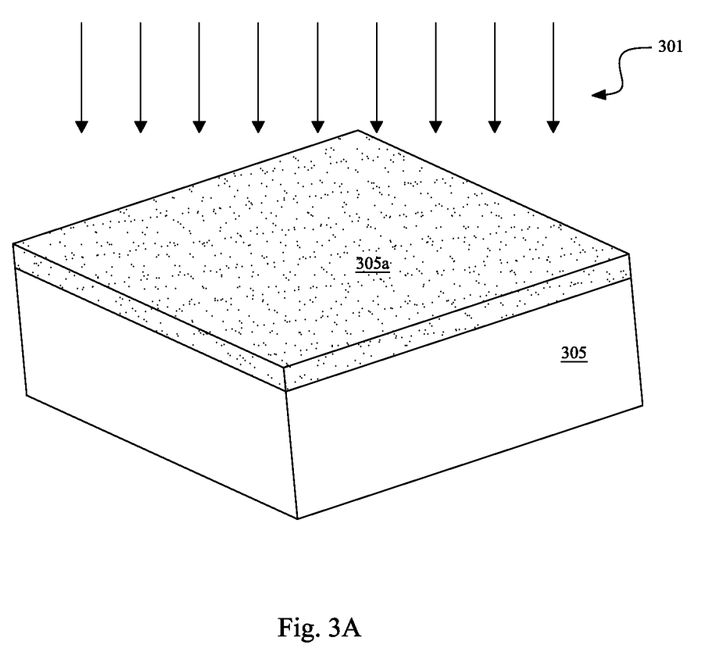
FIGS. 3A-3H are schematic 3-D drawings illustrating an exemplary method for forming a FinFET.

FIGS. 3A-3H are schematic 3-D drawings illustrating an exemplary method for forming a FinFET. In FIG. 3A, a P-type doped layer 305a is formed over a substrate 305 by an ion implantation 301. In some embodiments, the ion implantation 301 can use P-type dopant such as boron (B) for implantation. The P-type doped layer 305a can have a dopant concentration of about $1E15$ $cm^{-2}$ or more. In some embodiments for 32-nm technology, the P-type doped layer 305a can have a thickness of about 200 nm.

Figure 3B:
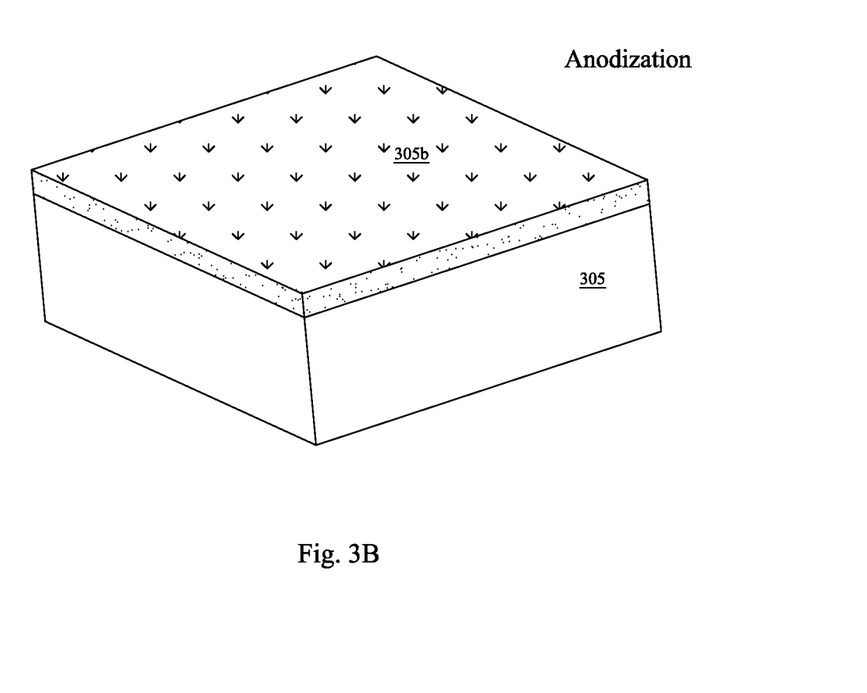

In FIG. 3B, the P-type doped layer 305a (shown in FIG. 3A) can be anodized to form a porous silicon layer 305b. In some embodiments, the P-type doped layer 305a can be immersed in a diluted hydrofluoride (HF) solution for the anodization process. The diluted HF solution can have a ratio of $H_2O$ to HF from about 100:1 or more. In some embodiments, the P-type doped layer 305a can be anodized in the diluted HF solution at a current density of about 15 $mA/cm^2$ for about 30 seconds. One of ordinary skill in the art is able to select desired solutions and/or adjust the current density and time to achieve a desired porous silicon layer 305b.

In some embodiments using a P-type substrate, the ion implantation 301 may be saved if the P-type substrate can provide a desired amount of electron-hole pairs for anodization. In some embodiments using an N-type substrate, the substrate 305 can be exposed to a light source for generating a desired amount of electron-hole pairs while anodizing the substrate 305. The light source can be, for example, an ultraviolet (UV) light source, an infrared (IR) light source, a visible light source, a laser light source, an electroluminescence light source, a sonoluminescence light source, a triboluminescence light source, a radiation source, other suitable light source, and/or combinations thereof. In some embodiments, the exposure can be performed through the anodization process. In some other embodiments, the exposure time can vary depending on the concentration of the chemical, e.g., HF, of the anodization process, the current of the anodization process, a desired depth of the anodization process, other factor, and/or combinations thereof. In some embodiments using an anodization current of about 20 mA and an anodization solution having 100:5 HF solution for forming a 20-nm anodized depth, the time is about 60 second. The intensity of the light source can be from about 400 candelas (CD) to about 700 CD. From the foregoing, one of skill in the art is able to select the type of the substrate 305 and modify the process for anodizing the substrate 305 accordingly. The scope of this application is not limited thereto.

Figure 3C:
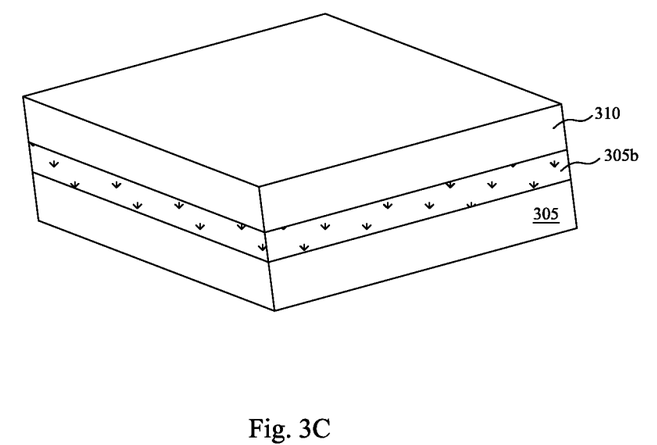

In FIG. 3C, a fin layer 310 can be formed over the porous silicon layer 305b. The fin layer 310 is provided to form at least one fin over the porous silicon layer 305b. In some embodiments, the fin layer 310 can include at least one material, such as silicon, germanium, compound semiconductor (silicon carbide, gallium arsenide, indium arsenide, or indium phosphide), other semiconductor materials, and/or combinations thereof. In some embodiments, the fin layer 310 can be formed by epitaxial processes, CVD processes, other methods that are capable of forming the fin layer 310, and/or combinations thereof. In some embodiments for 32-nm technology, the fin layer 310 can have a thickness of about 600 nm.

Figure 3D:
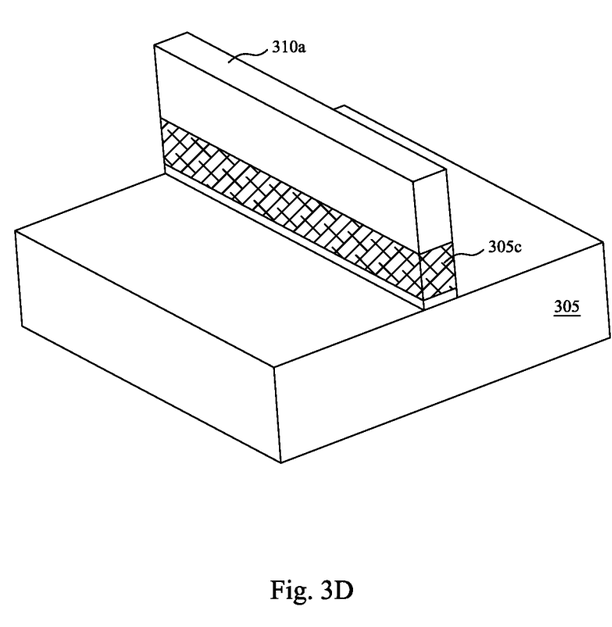

In FIG. 3D, processes are provided to remove portions of the fin layer 310 and the porous silicon layer 305b (shown in FIG. 3C) to define at least one fin 310a and the porous silicon portion 305c. In some embodiments, the processes can include such as photolithography, wet etching, dry etching (e.g., reactive ion etch (RIE)), plasma etching, and/or other suitable processes. In some embodiments, the processes can etch through the porous silicon layer 305b to remove a portion of the substrate 305. In some embodiments, the processes to define the fin 310a and the porous silicon portion 305c can be referred to as a STI etching process.

Figure 3E:
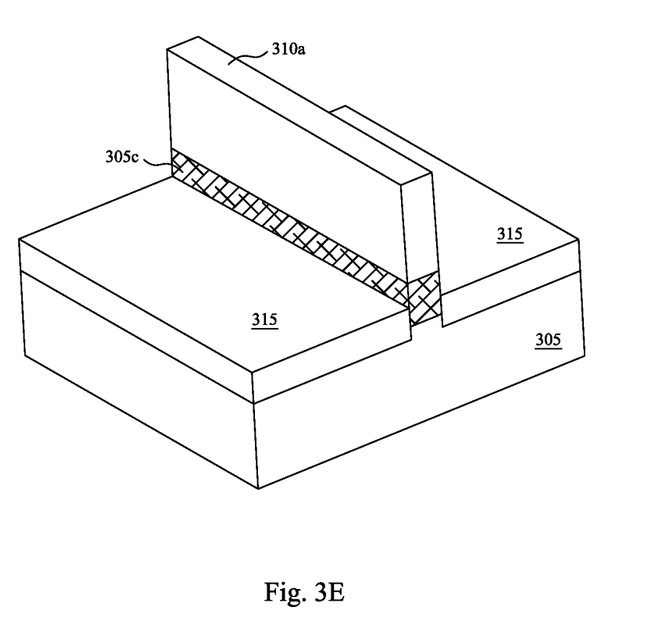

In FIG. 3E, a dielectric layer 315 can be formed over the substrate 305 and adjacent to the porous silicon portion 305c. The top surface of the dielectric layer 315 can be below the bottom surface of the fin 310a. In some embodiments for forming a plurality of fins 310a, isolation features (not shown) can substantially fill the region(s) between the fins. The isolation features may provide a substantially planar top surface of the device. For example, the top surface of the isolation features and the top surface of the plurality of fins may be co-planar and provide a single planar surface on the substrate. The isolation features may be formed by filling the region between the fins with insulating material and performing a chemical mechanical polish (CMP) process to planarize the surface. The isolation features may be referred to as shallow trench isolation (STI) features. The isolation features may include an insulating material. Example insulating materials include silicon oxide, silicon nitride, silicon oxynitride, fluoride-doped silicate glass (FSG), a low-k dielectric material, and/or other suitable compositions. In some embodiments, portions of the isolation features can be removed to form the dielectric layer 315. The isolation features may be removed using wet etch, dry etch, plasma etching, and/or other suitable processes. The process for forming the dielectric layer 315 can be referred to as a gap-fill process.

Figure 3F:
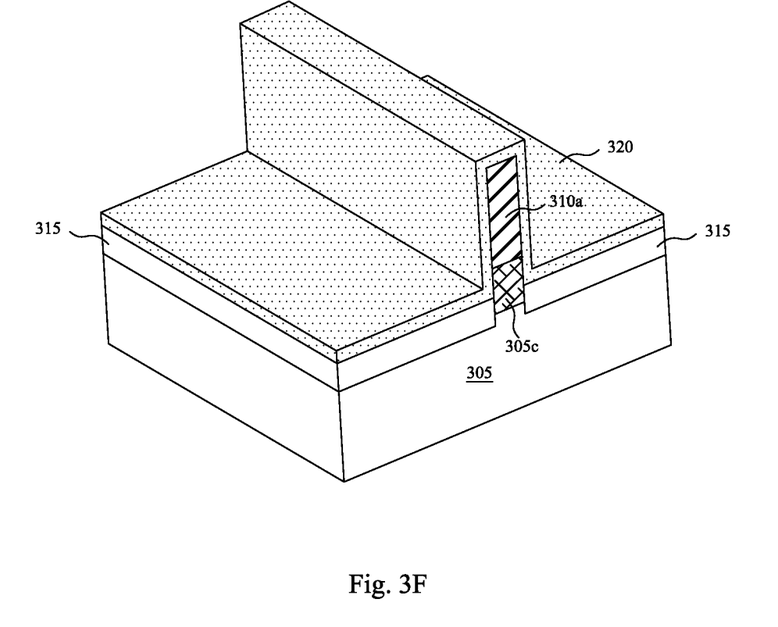

In FIG. 3F, a gate dielectric 320 can be formed over the structure illustrated in FIG. 3E. The gate dielectric 320 can include a single layer or a multi-layer structure. In some embodiments for forming a multi-layer structure, the gate dielectric 320 can include an interfacial dielectric layer and a high-k dielectric layer. The interfacial dielectric layer may be formed by any suitable process and any suitable thickness. For example, the interfacial dielectric layer may include at least one material, such as silicon oxide, silicon nitride, silicon oxynitride, other gate dielectric materials, and/or combinations thereof. The interfacial dielectric layer can be formed by thermal processes, CVD processes, ALD processes, epitaxial processes, and/or combinations thereof.

In some embodiments, the high-k dielectric layer can be formed over the interfacial layer. The high-k dielectric layer can include high-k dielectric materials such as $HfO_2$, HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer may be formed by any suitable process, such as ALD, CVD, PVD, RPCVD, PECVD, MOCVD, sputtering, plating, other suitable processes, and/or combinations thereof.

Figure 3G:
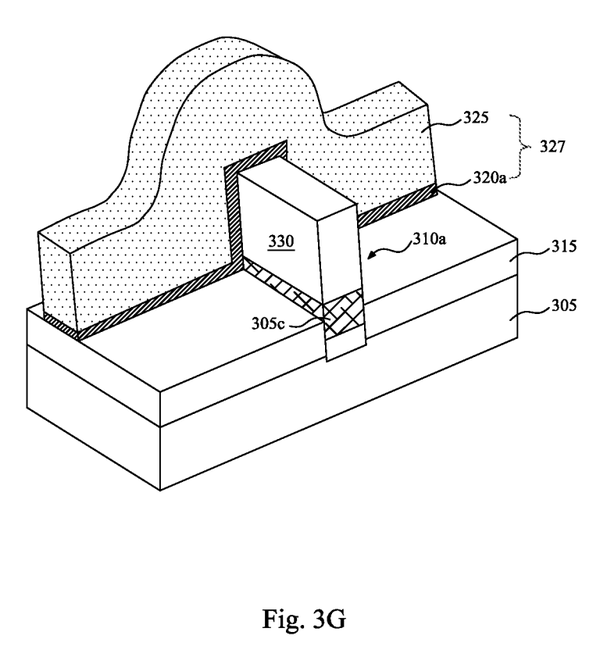

In FIG. 3G, a gate 327 including a gate electrode 325 over a gate dielectric 320a can be formed over the fin 310a and the dielectric layer 315. In some embodiments, the gate electrode 325 can include metallic materials such as Ti, TiN, TaN, Ta, TaC, TaSiN, W, WN, MoN, MoON, $RuO_2$, and/or other suitable materials. The gate electrode 325 may include one or more layers formed by physical vapor deposition (PVD), CVD, ALD, plating, and/or other suitable processes. In at least one embodiment, the gate electrode 325 includes a work function metal layer such that it provides an N-metal work function or P-metal work function of a metal gate. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

Referring again to FIG. 3G, source/drain regions 330 can be formed by implanting p-type or n-type dopants depending on the desired transistor configuration. In some embodiments for forming an NMOSFET, an n+ implant forms source/drain regions 330 associated with the transistor. The implant can include an n+ implant such as phosphorus, arsenic, antimony, or other suitable dopant. In some embodiments for forming a PMOSFET, a p+ implant forms source/drain regions 330 associated with the transistor. The implant can include a p+ implant such as boron (B) or other suitable dopant.

Figure 3H:
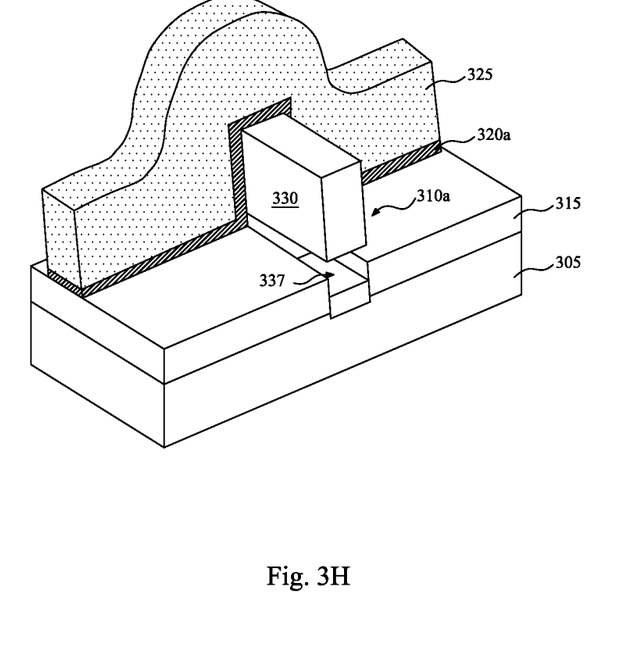

In FIG. 3H, the porous silicon portion 305c (shown in FIG. 3G) can be removed to form at least one air gap, e.g., air gap 337, between the fin 310a and the substrate 305. The removing process can include wet and/or dry etching processes that have a desired etching selectivity for the porous silicon portion 305c to other materials around it. In some embodiments, the porous silicon portion 305c can be removed by using diluted HF solutions ($H_2O$ to HF about 500:1 or more), ammonia hydroxide-hydrogen peroxide-water mixtures (APM), other solutions that can desirably remove the porous silicon portion 305c, and/or the combinations thereof. As shown in FIG. 3G, in some embodiments, at least a portion of the sidewall of the porous silicon portion 305c is exposed. An etching solution can reach the porous silicon portion 305c, substantially removing the porous silicon portion 305c. It is noted that the air gap 337 can insulate the source/drain region 330 from the substrate 305, eliminating leakage paths between the source/drain region 330 and the substrate 305.

Figure 4:
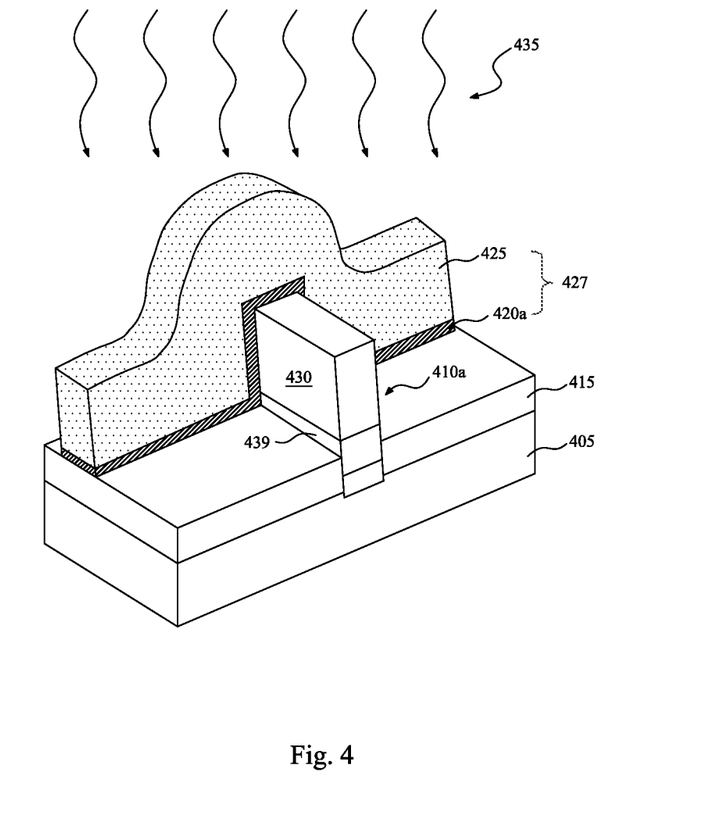
FIG. 4 is a schematic drawing illustrating an exemplary process for forming at least one oxide-containing layer insulating a fin from a substrate.

FIG. 4 is a schematic drawing illustrating an exemplary process for forming an oxide-containing layer insulating a fin from a substrate. In FIG. 4, items that are the same or similar items in FIGS. 3A-3G are indicated by the same reference numerals, increased by 100. These items can formed by the processes described above in conjunction in FIGS. 3A-3G. In some embodiments, after forming the porous silicon portion 305c (shown in FIG. 3G), a process 435 can be performed to form an oxide-containing material 439 by reacting the porous silicon portion 305c with an oxygen-containing gas such as oxygen. The process 435 can include, for example, a rapid thermal oxidation (RTO) process, thermal process, other processes that can desirably form the oxide-containing layer, and/or the combinations thereof. Due to the porosity of the porous silicon portion 305c, the oxygen-containing gas can desirably flow into the region of the porous silicon portion 305c under the gate 327. The amount of oxygen-containing gas under the gate 327 can be substantially equal to that under the source/drain region 330. The porous silicon portion 305c under the gate 327 can be simultaneously oxidized. After the oxidation, the interface between the oxide-containing layer 439 and the fin 430a can be substantially planar and substantially free from any tips formed at the interface. It is noted that the oxide-containing material 439 insulates the substrate 405 from the source/drain region 430. The oxide-containing material 439 can eliminate leakage paths between the substrate 405 and the source/drain region 430.

It is noted that the process 435 to oxidize the porous silicon portion 305c can be adjusted. In at least one embodiment, the process 435 can be performed after the definition of the fin 410a, which can be referred to as the definition of the fin 310a described above in conjunction with FIG. 3D. In another embodiment, the process 435 can be performed after the formation of the dielectric layer 415, which can be referred to as the formation of the dielectric layer 315 described above in conjunction with FIG. 3E. In yet another embodiment, the process 435 can be performed after the formation of the gate dielectric, which can be referred to as the formation of the gate dielectric 320 described above in conjunction with FIG. 3F. One of ordinary skill in the art is able to adjust the oxidation process 435 to obtain a desired oxide-containing layer 439.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Fin field effect transistor (FinFET) comprising:
a fin disposed over a substrate;
a gate disposed over a channel portion of the fin, wherein the gate comprises:
a gate dielectric layer; and
a gate electrode layer over the gate dielectric layer;
a source region disposed at a first end of the fin;
a drain region disposed at a second end of the fin, wherein the source region and the drain region are spaced from the substrate by at least one air gap;
a dielectric layer for insulating the gate from the substrate, wherein the gate dielectric layer contacts a portion of the dielectric layer; and
a porous silicon region between the substrate and the fin.

2. A Fin field effect transistor (FinFET) comprising:
a fin disposed over a substrate;
a gate disposed over a channel portion of the fin, wherein the gate comprises:
a gate dielectric layer; and
a gate electrode layer over the gate dielectric layer;
a source region disposed at a first end of the fin;
a drain region disposed at a second end of the fin, wherein the source region and the drain region are spaced from the substrate by at least one air gap; and
a dielectric layer for insulating the gate from the substrate, wherein the gate dielectric layer contacts a portion of the dielectric layer, and wherein the dielectric layer does not extend over a portion of the substrate beneath the fin.

3. A semiconductor device comprising:
a plurality of fin field effect transistors (FinFETs), wherein each FinFET comprises:
a fin over a substrate;
a porous silicon region between the substrate and the fin;
a gate over a channel portion of the fin, wherein the gate comprises:
a gate dielectric layer; and
a gate electrode layer over the gate dielectric layer;
a source region at a first end of the fin; and
a drain region at a second end of the fin, wherein the source region and the drain region are spaced from the substrate by at least one air gap which extends under less than an entirety of the gate;
an isolation feature separating one of the plurality of FinFETs from another of the plurality of FinFETs; and
a dielectric layer for insulating the gate from the substrate, wherein the gate dielectric layer contacts a portion of the dielectric layer.

4. The FinFET of claim 1, wherein a bottom surface of the fin is over a top surface of the dielectric layer.

5. The FinFET of claim 1, wherein the source and the drain are physically separated from the dielectric layer.

6. The FinFET of claim 1, wherein the air gap has a thickness of about 200 nanometers (nm).

7. The FinFET of claim 1, wherein the gate dielectric layer comprises:
   an interfacial layer having a thickness ranging from 8 Angstroms (Å) to 10 Å; and
   a high k dielectric layer having a thickness of about 40 Å.

8. The FinFET of claim 1, wherein the dielectric layer does not extend over a portion of the substrate beneath the fin.

9. The FinFET of claim 2, wherein a bottom surface of the fin is over a top surface of the dielectric layer.

10. The FinFET of claim 2, wherein the source and the drain are physically separated from the dielectric layer.

11. The FinFET of claim 2, wherein the air gap has a thickness of about 200 nanometers (nm).

12. The FinFET of claim 2, wherein the gate dielectric layer comprises:
   an interfacial layer having a thickness ranging from 8 Angstroms (Å) to 10 Å; and
   a high k dielectric layer having a thickness of about 40 Å.

13. The semiconductor device of claim 3, wherein a bottom surface of the fin of each of the plurality of FinFETs is over a top surface of the dielectric layer.

14. The semiconductor device of claim 3, wherein the source and the drain of each of the plurality of FinFETs are physically separated from the dielectric layer.

15. The semiconductor device of claim 3, wherein the isolation feature comprises silicon oxide, silicon nitride, silicon oxynitride, or fluoride-doped-silicate glass.

16. The semiconductor device of claim 3, wherein the isolation feature is in the dielectric layer.

17. The semiconductor device of claim 3, wherein the gate dielectric layer comprises an interfacial layer having a thickness ranging from 8 Angstroms (Å) to 10 Å.

18. The semiconductor device of claim 17, wherein the interfacial layer comprises silicon oxide, silicon nitride or silicon oxynitride.

19. The semiconductor device of claim 3, wherein the gate dielectric layer comprises a high k dielectric layer having a thickness of about 40 Å.

20. The semiconductor device of claim 3, wherein the air gap has a thickness of about 200 nanometers (nm).

* * * * *